US006909754B2

United States Patent
Breems et al.

(10) Patent No.: US 6,909,754 B2
(45) Date of Patent: Jun. 21, 2005

(54) METHOD AND QUADRATURE DEVICE FOR COMPENSATING MISMATCH IN PARALLEL PATHS BY SWITCHING SIGNALS THEREIN

(75) Inventors: Lucien Johannes Breems, Maassluis (NL); Eise Carel Dijkmans, Eindhoven (NL); Eric J. Van Der Zwan, deceased, late of Eindhoven (NL); by Henricus J. Kunnen, legal representative, Valkenswaard (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 775 days.

(21) Appl. No.: 09/805,481

(22) Filed: Mar. 13, 2001

(65) Prior Publication Data

US 2002/0051497 A1 May 2, 2002

(30) Foreign Application Priority Data

Mar. 15, 2000 (EP) .......................................... 00200942

(51) Int. Cl.$^7$ ................................................. H04L 5/12
(52) U.S. Cl. ...................................................... 375/261
(58) Field of Search ............................... 375/259–261, 375/295, 298, 316, 324, 340

(56) References Cited

U.S. PATENT DOCUMENTS 4,048,574 A    9/1977    Barbier et al. .................. 330/9
5,978,823 A *  11/1999   Koslov et al. ............... 708/313
6,157,235 A    12/2000   Bautista et al. .............. 327/254

OTHER PUBLICATIONS

J. Crols et al., "Low–IF Topologies for High–Performance Analog Front Ends of Fully Integrated Receivers", IEEE Transactions on Circuits ans Systems–II: Analog and Digital Processing; vol. 45, No. 3, Mar. 1998, pp. 269–282.

Donald A. Kerth et al, "An Oversampling Converter for Strain Gauge Transducers", vol. 27, No. 12, Dec. 1992, pp. 1689–1696. (Abstract).

* cited by examiner

Primary Examiner—Kevin Burd
(74) Attorney, Agent, or Firm—Aaron Waxler

(57) ABSTRACT

A quadrature device 1 for a communication device, receiver, transmitter, transceiver, telephone, mixer, modulator or demodulator comprises I and Q signal paths and corresponding signal paths components 2I, 2Q; 4I, 4Q; 9I, 9Q showing a mismatch. The device 1 comprises switching circuitry 3, 3', 6, 3", 3'" for data dependently exchanging the I and Q signals in the I and Q paths in order to improve adverse effects, such as reduction of leakage of quantisation noise from the image band to the signal band in a quadrature modulator. Even mismatch effects between digital to analog converters (DAC's) in a feedback path of a sigma delta ($\Sigma\Delta$) modulator are compensated.

11 Claims, 2 Drawing Sheets

METHOD AND QUADRATURE DEVICE FOR COMPENSATING MISMATCH IN PARALLEL PATHS BY SWITCHING SIGNALS THEREIN

The present invention relates to a quadrature device comprising I and Q signal paths and corresponding signal paths components showing a mismatch.

The present invention also relates to a receiver, transmitter, transceiver, modulator or demodulator, comprising a such a quadrature device, and to a method for reducing the effects of a mismatch between I and Q signal paths in a quadrature device.

Such a quadrature device is known from an article, entitled 'Low-IF Topologies for High-Performance Analog Front Ends of Fully Integrated Receivers', IEEE Transactions on Circuits and Systems-II: Analog and Digital Signal Processing, Vol. 45, No. 3, March 1998, pp 269–282 by J. Crols and M. S. J. Steyaert. For example in a RF receiver, such as an IF receiver, in particular a Near Zero IF (NZIF) or Zero-IF receiver, frequency down conversion is performed in a quadrature architecture in order to prevent lower and upper sidebands of a wanted signal to be stacked on one another at zero frequency. The matching of signal path components in both I and Q paths, in this case the demodulation paths, determines how good a signal which is mirrored relative to the wanted signal is suppressed. In particular in an IF receiver extra suppression means in the form of double quadrature configurations and/or image rejection filters, such as polyphase filters are likely to be needed, because the mirrored signal can have a larger amplitude than the wanted signal. Crosstalk which results from a poor mirror suppression is highly undesirable in present day receivers such as in mobile telephones, as it degrades performance thereof.

It is an object of the present invention to provide a quadrature device, whose properties are less dependent on a possible mismatch of corresponding I and Q signal path components used in said quadrature device.

Thereto the quadrature device according to the invention is characterized in that the quadrature device comprises switching means for exchanging the I and Q signals in said paths. Accordingly the method according to the invention is characterized in that the effects of said mismatch are reduced by exchanging I and Q signals in said paths.

It has been found that in particular the adverse amplitude and phase error effects resulting from a possible mismatch of signal path components in each of the respective I and Q paths can be reduced by alternately switching, that is exchanging the corresponding I and Q signals fed to the I and Q paths respectively. This principle appears to be applicable to a variety of quadrature communication devices, such as a receivers, transmitters, transceivers, telephones, modulators and demodulators, whose properties can simply be improved by only applying easy to manufacture switching means.

An embodiment of the quadrature device according to the invention is characterized in that the signal paths components comprise amplifiers, attenuators, filters, mixers, converters, such as digital to analog converters (DAC) or analog to digital converters (ADC) and the like.

In each of these signal path components arising mismatch effects can be reduced by applying the switching technique disclosed herein.

Another embodiment of the quadrature device according to the invention is characterized in that the quadrature device is a sigma-delta A/D converter having I and Q feedback paths and D/A converters in the feedback paths for exchanging I and Q feedback signals.

Advantageously the present technique is also applicable in a sigma delta modulator, whereby the mismatch effects, such as amplitude and phase mismatch present in the I and Q feedback paths respectively, are now compensated for.

The present invention can also be applied to a quadrature device, which is characterized in that the switching means are equipped for performing an I and Q data dependent exchange of the I and Q signals. In particular in a sigma-delta A/D converter the data dependent exchange takes place on an exclusive OR basis.

Exclusive OR based exchange of the I and Q signals reduces said mismatch effects and advantageously does not result in a mixing back to the signal band of quantisation noise, which is present around the exchange frequency. Thus there is no leakage from the image band to the signal band. The only effect of a data dependent exchange of signals is that the output spectrum of the modulator shows a small phase turn, which is equal for both quadrature paths.

In addition the method according to the present invention is characterized in that the exchanging takes place with a switching frequency which exceeds the bandwidth of the I and Q signals.

This way the switching frequency will not interfere with the actual I and Q signal frequencies.

The present technique is also applicable in for example a analog to digital converter, whereby the invention is characterized in that the quadrature device is a sigma delta modulator producing I and Q output bitstreams, and that I and Q feedback signals from said output bitstreams are being exchanged.

Generally a still further embodiment of the method according to the invention is characterized in that the exchanging has a rate which is a multiple of the sampling frequency of said bitstreams.

These multiples can easily be generated from a sampling frequency signal by means of dividers.

Data dependent switching is possible in another embodiment of the method according to the invention, which is characterized in that the exchanging of the I and Q signals takes place in dependence on their I and Q data content.

A preferred embodiment of the method according to the invention is characterized in that the exchanging of the I and Q paths takes place on an exclusive OR basis, whereby alternately the I and Q signals are fed back as they are or are fed back interchanged in exclusive OR dependence on the I and Q data bit content.

At present the quadrature device and method according to the invention will be elucidated further together with their additional advantages, while reference is being made to the appended drawing, wherein similar components are being referred to by means of the same reference numerals. In the drawing.

Figure 1:
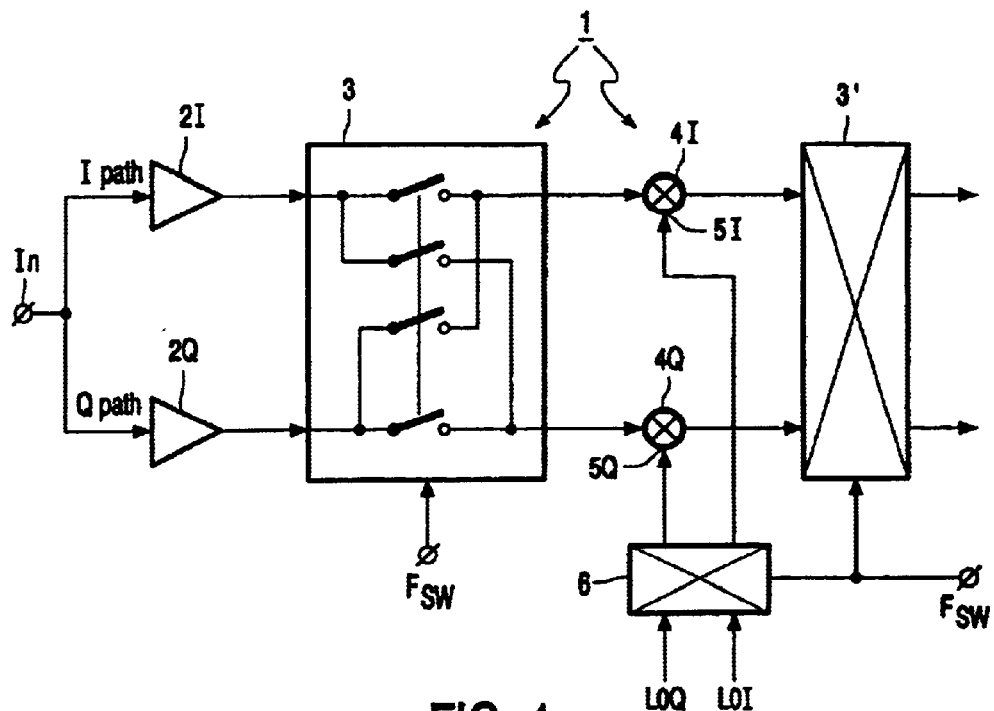
FIG. 1 shows a relevant part of a quadrature device of the present invention for explaining the method according to the invention.

FIG. 1 shows a part of a quadrature device 1. Such a quadrature device 1 may be any kind of device 1 showing a I signal path and a Q signal path respectively. Examples of such a quadrature device 1 are: a modulator, demodulator, mixer as for example applicable in a communication device, such as a telephone, in particular a mobile or cellular telephone. Usually frequency conversion takes place in RF quadrature devices. Because of a mismatch in electric properties of components included in each of these I and Q paths the resulting rejection of image frequencies is poor. This results in crosstalk between signal bands, which is particularly unwanted for communication devices.

The I and Q paths as shown in FIG. 1 comprise amplifiers, attenuators, filters, converters and the like schematically included and shown as gain/conversion blocks 2I and 2Q respectively. Principally the signals input at terminal In are identical. However different electric properties of the blocks 2I and 2Q result in an amplitude mismatch of input signals for the remainder of the quadrature device 1. If such blocks 2I and 2Q and device 1 were to apply in a well known heterodyne IF receiver, then the amplitude mismatch and the phase mismatch between the resulting input signals causes leakage from the signal band to the image band of the signal band and vice versa. A variety of possible embodiments of such a device or receiver can be found in the article in IEEE referred to above.

The quadrature device 1 of the FIG. 1 is provided with switching means 3 in the form of an array of controllable switches, which are shown schematically. The controllable switches are being controlled by a control signal Fsw on a control input of the means 3. In one controlled position the switching means 3 connect the signals in the I path and Q paths straight from left to right, while in the other position the I signal goes down to the Q path and the Q signal goes back to the I path. The controlled exchange of the I and Q signals takes place at such a high pace that the content of the I and Q signals is not being bothered thereby. Any amplitude mismatch and phase mismatch between the I and Q signals, if applied in a modulator such as for example in a ΣΔ modulator to be described later, which resulted in a leakage of signals from the image band of the modulator to the signal band and vice versa, is now reduced effectively.

In a further possible embodiment two mixers 4I and 4Q are provided in the I and Q paths respectively. The mixers 4I and 4Q have local oscillator inputs 5I and 5Q respectively each coupled through I and Q control signal switching means 6 to a control signal input Fsw. The mixers 4I and 4Q give rise to phase and amplitude errors, which may again be reduced by inserting controllable switching means 3' in the I and Q paths. The switching means 3' are controlled by the same signal Fsw as the control signal switching means 6 in order to mix both I and Q signals with their proper control signals even if these are exchanged. This switching reduces the effects of phase and amplitude mismatch in the mixers 4I and 4Q. It is to be noted that for the proper functioning of the reduction the gain/conversion blocks 2I and 2Q may be connected, either before, and/or after the quadrature mixers 4I and 4Q.

Figure 2:
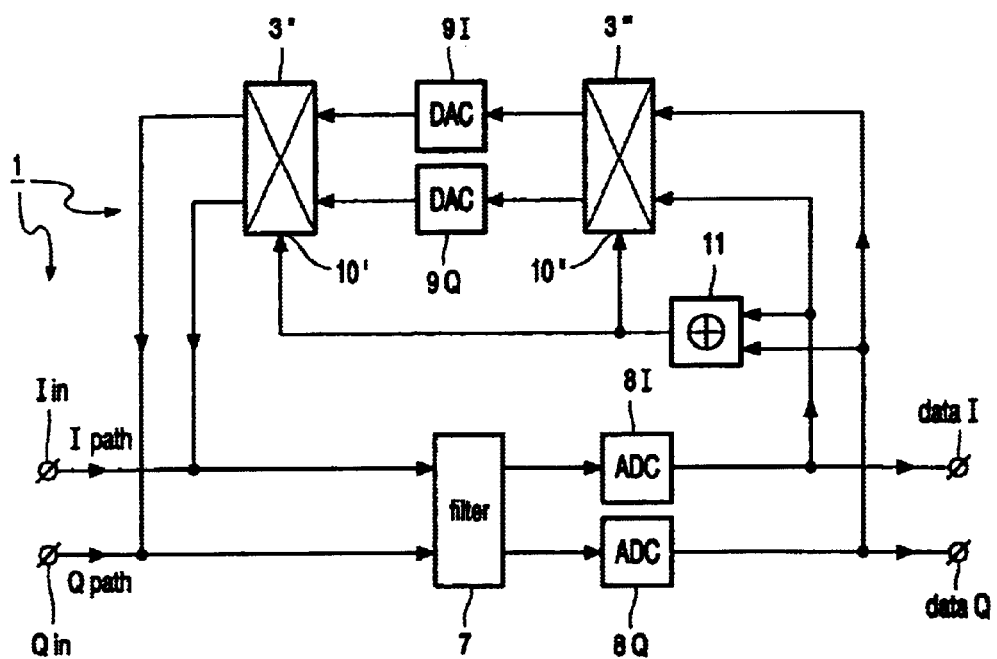
FIG. 2 shows a quadrature device embodied and exemplified as a so called ΣΔ modulator for elucidating the method according to the invention.

FIG. 2 shows a quadrature device 1 embodied and exemplified as a so called sigma delta (ΣΔ) modulator for further elucidating the device 1 as well as the method for reducing the effects of any mismatch between signal paths in the quadrature device. The quadrature modulator device 1, which can for example be used for A/D conversion in communication device in a GSM telephone channel, further comprises a quadrature loopfilter 7, two AD converters 8I and 8Q, and two DA converters 9I and 9Q coupled in a feedback loop of the modulator. In that case the complex data output streams I and Q define for example a signal band from 0 Hz to 200 KHz. In this case two main causes of mismatch may be distinguished, namely phase and amplitude mismatch between I and Q input signals on inputs Iin and Qin (to be reduced by the method and device of FIG. 1), and phase and amplitude mismatch of the I and Q feedback signals from the DA converters 9I and 9Q in the feedback loop of the modulator 1 (to be dealt with by the method and device of FIG. 2). It is to be noted that the embodiments of FIGS. 1 and 2 could also be combined such that outputs Iout and Qout of the FIG. 1 embodiment is coupled to the inputs Iin and Qin of the FIG. 2 embodiment. Both of said mismatches give rise to unwanted leakage to the signal band of image band signals and quantisation noise. The mismatch errors thus introduced may be severe, as will be illustrated in the following practical example. Typical image rejection is around −45 dB at 1% mismatch. The modulator input signal may be as small as −90 dB, while the image signal may be 40 to 50 dB stronger. In that case the image signal leaked into the signal band is as strong as the wanted signal itself.

Image rejection can be improved by interchanging of the I and Q paths by means of controllable switching means 3" and 3'" included before and after the DAC's 9I and 9Q. In this case the control on control inputs 10' and 10" of the DAC's is I and Q digital data dependent. Thereto the control inputs 10' and 10" are coupled through Exclusive OR means 11 to the respective data I and data Q outputs. For example the exclusive OR means 11 control the switching means 3" and 3'" such that if the logical levels of the digital data I and Q signals differ, the I and Q feedback paths are exchanged, and not exchanged if the I and Q signals are equal. Therewith the mismatch in the feedback paths, which is due to a mismatch between the DAC's 9I and 9Q, is modulated data dependent thus reducing image interference and quantisation noise disturbance. A main cause of DAC mismatch is due to mismatch between DAC internal elements, which mismatch effects are thus reduced. Examples of these DAC internal elements are resistors, capacitors, current sources and/or voltage sources. The kind of element used depends on the particular implementation of the DAC concerned.

Figure 3A:
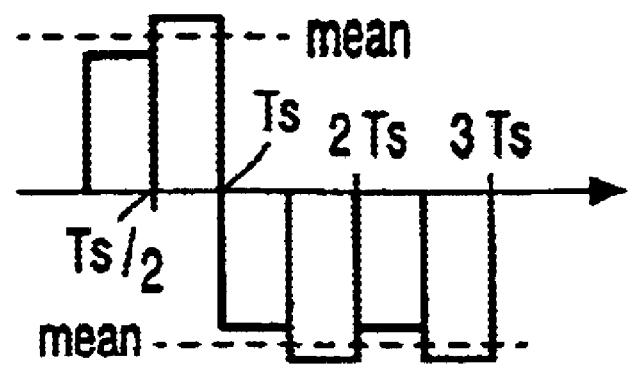
FIGS. 3a and 3b show data bit values created by a multiple of the DAC sample frequency.
Figure 3B:
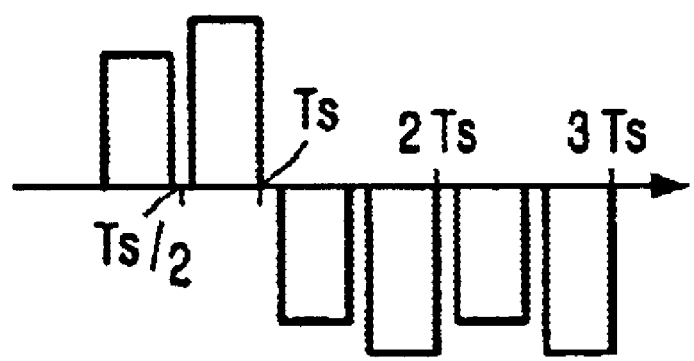

At wish the exchange rate may be a multiple of the sampling frequency of the ADC's. In a practical variant the exchange rate is such that during a first half of the sample period (Ts) of the I and Q databit streams, DAC 9I is in the I feedback path, whereas DAC 9Q is in the Q feedback path. During the second half of the sample period DAC 9I is in the Q feedback path and DAC 9Q is in the I feedback path. This way the mean bit value during both half bit periods remains the same. This situation is shown in FIG. 3a. FIG. 3b shows the similar situation in case the DAC's have an Return to Zero (RTZ) interval. Of course the DAC's may be single or multi-bit DAC's.

Whilst the above has been described with reference to essentially preferred embodiments and best possible modes it will be understood that these embodiments are by no means to be construed as limiting examples of the devices and methods concerned, because various modifications, features and combinations of features falling within the scope of the appended claims are now within reach of the person skilled in the relevant art.

What is claimed is:

1. A quadrature device (1) comprising I and Q signal paths and corresponding signal paths components (2I, 2Q; 4I, 4Q; 9I, 9Q) showing a mismatch, characterized in that the quadrature device (1) comprises switching means (3, 3', 6, 3") for exchanging the I and Q signals in said paths, and in that the quadrature device (1) is a sigma-delta A/D converter having I and Q feedback paths and D/A converters (9I, 9Q) in the feedback paths for exchanging I and Q feedback signals.

2. The quadrature device (1) according to claim 1, characterized in that the signal paths components (2I, 2Q; 4I, 4Q;

9I, 9Q) comprise amplifiers, filters, mixers (4I, 4Q) and converters, including digital to analog (D/A) converters (9I, 9Q) or analog to digital (A/D) converters (8I, 8Q).

3. The quadrature device (1) according to claim 1, characterized in that the switching means (3, 3', 6, 3") are equipped for performing an I and Q data dependent exchange of the I and Q signals.

4. The quadrature device (1) according to claim 3, characterized in that the data dependent exchange takes place on an exclusive OR basis.

5. A communication device, receiver, transmitter, transceiver, telephone, mixer, modulator or demodulator, comprising a quadrature device (1) according to claim 1.

6. A method for reducing the effects of a mismatch between I and Q signal paths in a quadrature device (1), comprising the steps of reducing the effects of said mismatch by exchanging of I and Q signals in said paths and providing the quadrature device (1) as a sigma-delta A/D converter having I and Q feedback paths and D/A converters (9I, 9Q in the feedback paths for exchanging I and Q feedback signals.

7. The method according to claim 6, characterized in that the exchanging takes place with a switching frequency which exceeds the bandwidth of the I and Q signals.

8. The method according to claim 7, characterized in that the quadrature device (1) is a sigma delta modulator producing I and Q bitstreams, and that I and Q feedback signals from said output bitstreams are exchanged.

9. The method according to claim 8, characterized in that the exchanging has a rate which is a multiple of the sampling frequency of said bitstreams.

10. The method according to claim 9, characterized in that the exchanging of the I and Q signals takes place in dependence on their I and Q data content.

11. The method according to claim 10, characterized in that the exchanging of the I and Q paths takes place on an exclusive OR basis, whereby alternately the I and Q signals are fed back as they are or are fed back interchanged in exclusive OR dependence on the I and Q data content.

* * * * *